US008835872B2

(12) United States Patent
Kobayashi

(10) Patent No.: US 8,835,872 B2
(45) Date of Patent: Sep. 16, 2014

(54) SAMPLE STAGE DEVICE

(75) Inventor: Takashi Kobayashi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/806,989

(22) PCT Filed: Jun. 23, 2011

(86) PCT No.: PCT/JP2011/064359

§ 371 (c)(1),
(2), (4) Date: Dec. 26, 2012

(87) PCT Pub. No.: WO2011/162325

PCT Pub. Date: Dec. 29, 2011

(65) Prior Publication Data

US 2013/0098274 A1        Apr. 25, 2013

(30) Foreign Application Priority Data

Jun. 25, 2010   (JP) ................................. 2010-145353

(51) Int. Cl.
*H01J 37/20* (2006.01)
(52) U.S. Cl.
CPC ....... *H01J 37/20* (2013.01); *H01J 2237/20285* (2013.01); *H01J 2237/20292* (2013.01); *H01J 2237/2817* (2013.01); *H01J 21/68* (2013.01)
USPC ............ 250/440.11; 250/441.11; 250/442.11; 318/649
(58) Field of Classification Search
USPC ............... 250/440.11, 441.11, 442.11, 443.1; 318/649
See application file for complete search history.

(56) References Cited

U.S. PATENT DOCUMENTS

| 7,435,974 B2 | 10/2008 | Matsushima |
| 8,174,229 B2 * | 5/2012 | Fujita et al. ................... 318/649 |
| 2012/0127478 A1 * | 5/2012 | Shibazaki et al. ............ 356/498 |

FOREIGN PATENT DOCUMENTS

| JP | 7-272660 A | 10/1995 |
| JP | 2004-134155 A | 4/2004 |
| JP | 2007-80660 A | 3/2007 |
| JP | 2007-142093 A | 6/2007 |
| JP | 2009-181923 A | 8/2009 |

OTHER PUBLICATIONS

International Search Report dated Jul. 26, 2011 issued in corresponding International Application No. PCT/JP2011/064359.
John Reeds, et al., "High speed precision X-Y stage", Journal of Vacuum Science & Technology B, vol. 3, No. 1, pp. 112-116 (1985).

* cited by examiner

*Primary Examiner* — Nicole Ippolito
(74) *Attorney, Agent, or Firm* — McDermott Will & Emery LLP

(57) ABSTRACT

A sample stage device (10) is so configured as to calculate ideal position information xtg(i), tg(i) per predetermined period that is unaffected by drive conditions relating to gaps (25, 26), etc., and to determine, per predetermined cycle and in real time, deviations dx(i), dy(i) between real-time measured positions x(i), y(i) by position detectors comprising laser interferometers (33, 34), etc., and ideal position information xtg(i), tg(i). In addition, it calculates, based on deviations dx(i), dy(i) thus determined, such speed command values vx(i), vy(i) for motors (27, 28) that measured values x(i), y(i) would follow ideal position information xtg(i), tg(i), and performs stable and high-speed positioning control for a sample table (11) through feedback control that controls speed in real time. Thus, with respect to a sample stage device, it is possible to provide a stable and high-speed positioning control method for a sample table, which is capable of suppressing noise caused by thermal drift and vibration, without being affected by drive conditions, such as the initial states of gaps, etc.

5 Claims, 3 Drawing Sheets

SAMPLE STAGE DEVICE

RELATED APPLICATIONS

This application is the U.S. National Phase under 35 U.S.C. §371 of International Application No. PCT/JP2011/064359, filed on Jun. 23, 2011, which in turn claims the benefit of Japanese Application No. 2010-145353, filed on Jun. 25, 2010, the disclosures of which Applications are incorporated by reference herein.

TECHNICAL FIELD

The present invention relates to a sample stage device that holds a sample and that is provided on an electron microscope device used for semiconductor inspection and evaluation, as well as to a positioning control method for a sample table that moves with a sample mounted thereon.

BACKGROUND ART

Ordinarily, in semiconductor device and integrated circuit fabrication processes, the shapes and dimensions of various patterns formed on wafers need to be inspected and evaluated with high precision. Accordingly, not only fabrication devices, but also inspection and evaluation devices are demanded high precision to accommodate the reduced sizes of such semiconductor devices and integrated circuits. As such, for the inspection of the shapes and dimensions of various patterns formed on wafers, scanning electron microscopes (also referred to herein as SEM) with a metrology function are used.

In wafer inspection by such SEMs with a metrology function, or so-called CD-SEMs, a secondary electron image is obtained by image processing secondary electron signals obtained by scanning a wafer with an electron beam, and the shape of the pattern is determined based on changes in the brightness thereof, thereby deriving the dimensions of the pattern under inspection. SEMs comprise a sample stage device for holding a sample. Sample stage devices are configured to position a sample table, which is capable of two-dimensional movement and on which a wafer is mounted, in accordance with the site on the wafer that is to be observed.

SEM inspection of various patterns formed on wafers is required to accommodate, for example, 35 nm node design rules, and obtaining a secondary electron image for an observation site on a wafer with little noise at a high observation magnification of ×300,000 or greater is an important issue. Further, improvements in the contrast of observed images by overlaying numerous secondary electron images on top of one another are also demanded. In order to meet such issues and demands, sample stage devices needed to suppress device vibration and drift (a phenomenon where the resting position of the sample table shifts over time) on a nm scale.

A wafer size currently often inspected is 300 mm. In line therewith, sample tables of sample stage devices for mounting wafers have also become quite large compared to before. At the same time, in order to improve throughput, sample stage devices must also move and position these large sample tables at high speed. With high-power drive mechanisms for moving such large sample tables, increases in temperature occur due to heat generated by motors and drive shafts.

Accordingly, in sample stage devices, as a means for preventing sample stage device drift caused by thermal expansion/contraction due to a rise in temperature resulting from such heat generation, there is a technique in which a 20 to 100 µm gap is provided between the sample table and its drive shaft, and the drive shaft is severed from the sample table when at rest (e.g., Patent Literature 1).

Further, there is a technique in which, during fine movement of the sample table, which is a weakness thereof due to the dead zone created by such a gap, the deviation of a measurement value, which is measured by a position detector that measures the current position of the sample table, from a pre-set target value is monitored, and, when the deviation from the target position falls to or below a certain value, the fine movement drive of the sample table is stopped (e.g., Patent Literature 2).

Through such techniques, sample stage devices provided on conventional electron microscope devices are able to perform positioning control of a sample table by an open loop using a pulse motor.

CITATION LIST

Patent Literature

Patent Literature 1: JP Patent Application Publication (Kokai) No. 2004-134155 A
Patent Literature 2: JP Patent Application Publication (Kokai) No. 2007-80660 A

SUMMARY OF INVENTION

Technical Problem

However, with the technique disclosed in Patent Literature 2, if the sample table is moved to a tentative target position at high speed prior to a low-speed movement of the sample table while the deviation between the current position and the target position is greater than the gap provided at the joint between the drive unit and the sample table, the actual resting position will vary due to this gap. Such variability in the resting position is due to various drive conditions of the sample table, such as the initial state of the gap (the initial gap state when moving to the tentative target position at high speed), vibration caused by changes in the acceleration of the sample table, the sample table's inertia, etc. Due to the variability of the actual resting position when the sample table is moved to a tentative target position at high speed, it will sometimes be necessary, during the subsequent low-speed movement to the actual target position, to continue moving the sample table at low speed by an extra amount corresponding to the discrepancy between the tentative target position and the actual resting position. Thus, with the technique disclosed in Patent Literature 2, there was a problem in that it took longer to move the sample table to the actual target position.

In addition, X-Y tables, which are provided on sample stage devices as sample tables capable of two-dimensional movement, comprise separate drive mechanisms for the X-axis direction and the Y-axis directions. As a result, due to the difference between the movement distances by the respective drive mechanisms, such problems as the stopping precision in the axial direction for which movement was completed first affecting and offsetting movement and stopping in the axial direction for which movement is subsequently completed may arise.

Further, because the movement to the actual target position is divided into several rounds of movements and stops by the sample table comprising high-speed movements and stops and low-speed movements and stops by the sample table, there was also a problem in that the control overhead becomes large.

Due to the above, conventional sample stage devices give rise to such problems as throughput variability, stopping precision variability due to changes in mechanical properties (properties of mechanical components), and so forth.

The present invention is made in view of the problems discussed above, and an object thereof is to provide, with respect to sample stage devices provided on electron microscope devices, a stable and high-speed sample table positioning control method capable of suppressing noise caused by thermal drift and vibration without being affected by such drive conditions as the initial gap state, etc.

Solution to Problem

In order to solve the problems mentioned above, a sample stage device of the present invention is configured to calculate, in real time, ideal position information that unaffected by drive conditions caused by gaps, etc., and to also determine, in real time, the deviation of a measured value measured by a position detector from the ideal position information. In addition, it is configured to calculate, based on the thus determined deviation, a motor speed command value so that the measured value follows the ideal position information, and to perform stable and high-speed sample stage positioning control through feedback control that controls speed in real time.

The present specification incorporates the contents of the specification and/or drawings of JP patent application no. 2010-145353 from which the present application claims priority.

Advantageous Effects of Invention

According to the present invention, a logical pattern for ideal position information that is unaffected by drive conditions is generated within a given control period in accordance with a control parameter specified through an operation screen, and a deviation from a laser metrology value is calculated. A speed command value that drives the motor in such a manner as to eliminate this positional deviation is calculated, and speed is controlled in real time. Thus, high-speed positioning control becomes possible without being affected by drive conditions resulting from the gap before driving the table, and so forth.

In addition, moving to a tentative target position becomes unnecessary, and it becomes possible to move directly to the actual target position. Control switching, such as between high-speed drive for moving to the tentative target position and low-speed drive for moving to the actual target position, etc., also becomes unnecessary, thereby making high-speed positioning control possible.

Further, it is possible to provide a stable and high-speed sample stage positioning control method capable of suppressing noise caused by thermal drift and vibration by severing the drive unit and the sample stage after driving the table.

DESCRIPTION OF EMBODIMENTS

Figure 1:
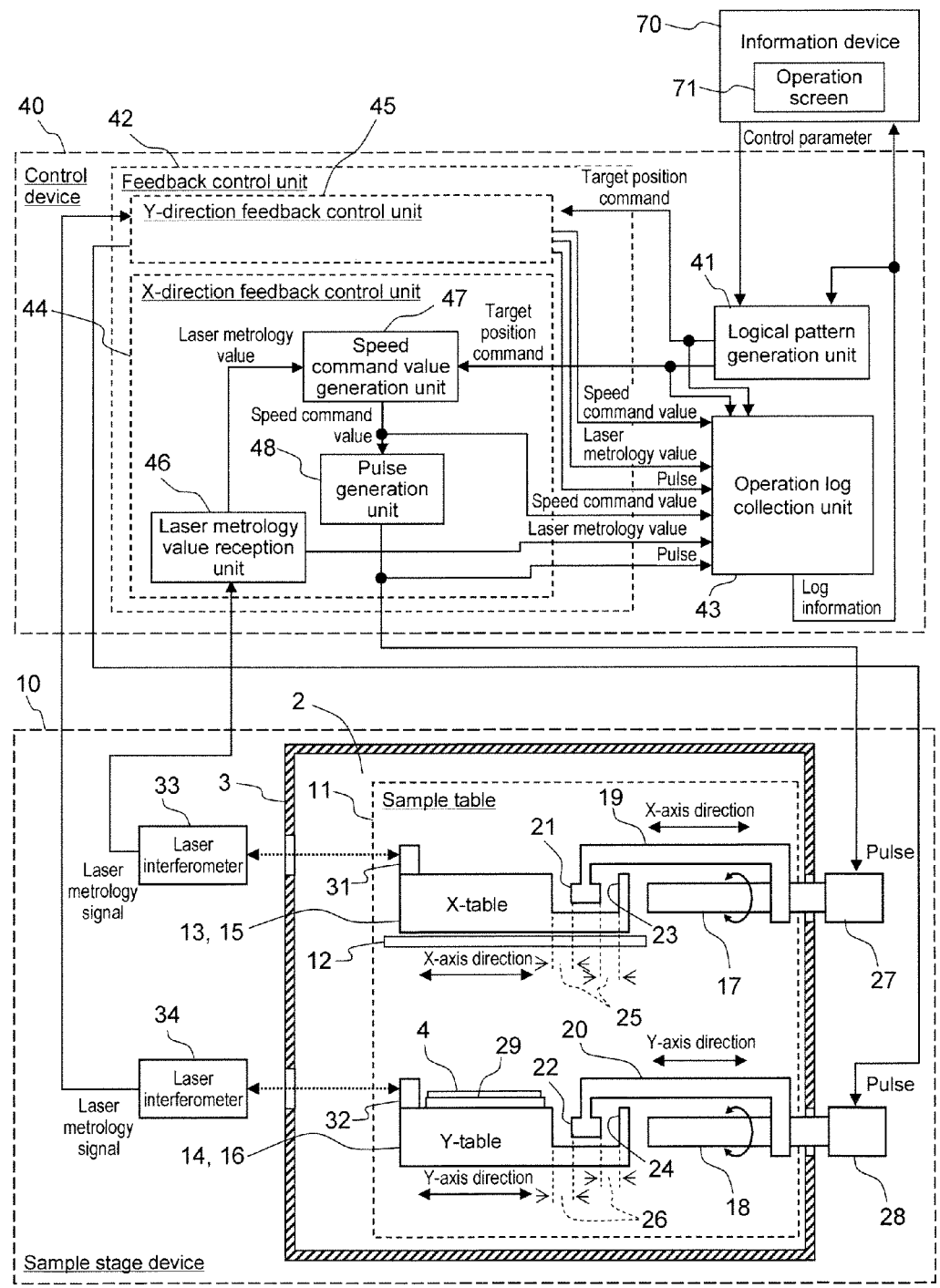
FIG. 1 is a diagram showing a schematic configuration of a sample stage device according to an embodiment of the present invention.

An embodiment of a sample stage device according to the present invention is described below based on the drawings FIG. 1 is a diagram showing a schematic configuration of a sample stage device according to the present embodiment.

The embodiment in FIG. 1 employs a sample stage device 10 in a sample chamber 2 of a scanning electron microscope. In this case, the sample chamber 2 of the scanning electron microscope is a vacuum chamber that can be evacuated with an unillustrated vacuum pump, and a sample table 11 is provided as a movable part of the sample stage device 10.

In the scanning electron microscope, a column, which is omitted in the diagram, is integrally connected to a sample chamber housing 3 that defines the sample chamber 2. The column houses an electron optical system for directing a primary electron beam onto a sample 4. The electron optical system comprises: an electron gun that generates a primary electron beam; a deflector that scans the incident position of the primary electron beam on the sample in accordance with the desired observation area; an objective lens that focuses the primary electron beam at an observation site in the observation area on the sample; etc. In addition, the sample chamber 2 or column of the scanning electron microscope comprises a secondary electron detector that detects secondary electrons emitted from the sample 4 as it is hit by the primary electron beam. With the scanning electron microscope, a detection signal, which is outputted from the secondary electron detector as a brightness signal, is inputted to an image processing unit after being amplified and A/D converted. The image processing unit forms a detection system of the scanning electron microscope together with the secondary electron detector, and generates an observed scan image of the observation area. The observed scan image generated by the image processing unit is supplied to an information device 70 comprising a computer device for controlling sample observation by the scanning electron microscope, and is displayed on a screen of a display 71 thereof.

The sample table 11 of the sample stage device 10 is so provided as to be able to move two-dimensionally inside the sample chamber 2. In the illustrated example, it is configured as an X-Y table comprising a base 12, a center table 13, and a top table 14.

The center table 13 is provided on the base 12 as an X-axis direction moving table 15 of the X-Y table in such a manner as to be able to move in the X-axis direction in a two-dimensional plane (X-Y plane) in the sample chamber 2. The X-axis direction moving table 15 is pushed and pulled in the X-axis direction by an X-axis rod 19 which is moved and displaced along its axis in accordance with the rotation of an X-axis ball screw 17 that extends in the X-axis direction. An engagement part 21 is formed on the X-axis rod 19, and this engagement part 21 engages with a groove-shaped guide part 23 so formed in the X-axis direction moving table 15 as to extend in the Y-axis direction. The X-axis direction groove width of the guide part 23 in the X-axis direction moving table 15 is greater than the X-axis direction width of the engagement part 21 of the X-axis rod 19 by a predetermined amount (e.g., 50 μm), thereby creating gap parts 25 between the engagement part 21 of the X-axis rod 19 and the groove side walls of the guide part 23.

By means of the gap parts 25, the engagement part 21 is able to place itself in a non-contact state where it is spaced apart from the groove side walls of the guide part 23 on both sides in the X-axis direction. In addition, the X-axis direction moving table 15 is able to move in the Y-axis direction along the length of the guide part 23 without being restrained by the engagement part 21 of the X-axis rod 19. Further, as the engagement part 21 of the X-axis rod 19, by moving in the X-axis direction, comes into contact with either groove side wall of the guide part 23 in the X-axis direction moving table 15, it begins to restrain the movement of the X-axis direction moving table 15 in the X-axis direction, and, through further movement, pushes and pulls the X-axis direction moving table 15 along the X-axis direction.

The X-axis ball screw 17 is linked with an X-axis pulse motor 27 comprising a stepping motor. Through forward/reverse rotation thereof, it displaces the X-axis rod 19 to advance/retreat along the X-axis direction, and ultimately moves the X-axis direction moving table 15 to advance/retreat along the X-axis direction.

The top table 14 is provided, as a Y-axis direction moving table 16 of the X-Y table, on the above-discussed X-axis direction moving table 15 as the center table 13 in such a manner as to be able to move in the Y-axis direction in a two-dimensional plane (X-Y plane) in the sample chamber 2. It is noted that in FIG. 1, with respect to the X-axis direction moving table 15 and the Y-axis direction moving table 16, for ease of comprehension and for purposes of convenience, connecting structures between the two have been omitted, and they have been represented as a schematic where they are placed side by side with the same directionality in the drawing. The Y-axis direction moving table 16 is pushed and pulled in the Y-axis direction by a Y-axis rod 20 which is moved and displaced along its axis in accordance with the rotation of a Y-axis ball screw 18 that extends in the Y-axis direction. An engagement part 22 is formed on the Y-axis rod 20, and this engagement part 22 engages with a groove-shaped guide part 24 so formed in the Y-axis direction moving table 16 as to extend in the X-axis direction. The Y-axis direction groove width of the guide part 24 in the Y-axis direction moving table 16 is greater than the Y-axis direction width of the engagement part 22 of the Y-axis rod 20 by a predetermined amount (e.g., 50 µm), thereby creating gap parts 26 between the engagement part 22 of the Y-axis rod 20 and the groove side walls of the guide part 24.

By means of the gap parts 26, the engagement part 22 is able to place itself in a non-contact state where it is spaced apart from the groove side walls of the guide part 24 on both sides in the X-axis direction. In addition, the Y-axis direction moving table 16 is able to move in the X-axis direction along the length of the guide part 24 without being restrained by the engagement part 22 of the Y-axis rod 20. Further, as the engagement part 22 of the Y-axis rod 20, by moving in the Y-axis direction, comes into contact with either groove side wall of the guide part 24 in the Y-axis direction moving table 16, it begins to restrain the movement of the Y-axis direction moving table 16 in the Y-axis direction, and, through further movement, pushes and pulls the Y-axis direction moving table 16 along the Y-axis direction.

The Y-axis ball screw 18 is linked with a Y-axis pulse motor 28 comprising a stepping motor. Through forward/reverse rotation thereof, it displaces the Y-axis rod 20 to advance/retreat along the Y-axis direction, and ultimately moves the Y-axis direction moving table 16 to advance/retreat along the Y-axis direction.

Further, the wafer 4 as a sample is positioned and mounted on the table of the Y-axis direction moving table 16 as the top table 14. A sample holder 29 that positions and holds the wafer 4 is affixed onto the sample table 11.

X-axis direction and Y-axis direction movement positions x and y of the X-axis direction moving table 15 and Y-axis direction moving table 16, respectively, are measured by means of bar mirrors 31 and 32 attached to the X-axis direction moving table 15 and Y-axis direction moving table 16, respectively, using laser interferometers 33 and 34 respectively corresponding thereto. The X-axis direction laser interferometer 33 and the Y-axis direction laser interferometer 34 receive from the corresponding bar mirrors 31 and 32 the reflected light of the respective emitted laser light, and measure, in real time, the X-axis direction and Y-axis direction movement positions x and y of the X-axis direction moving table 15 and Y-axis direction moving table 16, respectively, based on the reflected light thus received.

In FIG. 1, the center table 13 comprises the X-axis direction moving table 15, and the top table 14 comprises the Y-axis direction moving table 16. However, the center table 13 may instead comprise the Y-axis direction moving table 16, and the top table 14 the X-axis direction moving table 15.

With the thus configured sample stage device 10 of the present embodiment, the X-axis direction moving table 15 and the Y-axis direction moving table 16 are actuated and controlled by a control device 40 connected to the information device 70 that controls sample observation by the scanning electron microscope.

The information device 70 controls sample observation by the scanning electron microscope, such as by configuring observation conditions for sample observation by the scanning electron microscope, actuating and controlling the electron optical system based on the thus configured observation conditions, outputting onto the screen of the display 71 an observed age obtained by the detection system, and so forth. Further, in the present embodiment, the information device 70 also serves as an input/output device for the control device 40 of the sample stage device 10, such as by setting control parameters for driving the sample stage device 10 through an OSD (on-screen display) screen displayed on the screen of the display 71, displaying/outputting an operation log of the sample stage device 10 that is controlled and actuated by the control device 40 based on these control parameters, and so forth.

With respect to the movement of the sample table 11 comprising the X-axis direction moving table 15 and the Y-axis direction moving table 16, the information device 70 allows, by way of example, initial speed, maximum speed, maximum acceleration, target position, jerk time, severing distance, stopping threshold, etc., to be set as control parameters. It is noted that "initial speed" in this case does not indicate the speed at which the sample table 11 begins to move from rest, but instead the movement speed at which the sample table 11 moves to the target position as set by the operator. "Maximum speed" and "maximum acceleration" respectively indicate the "upper limit for speed" and "upper limit for acceleration" in moving the sample table 11. In addition, "target position" indicates the positional coordinates of the destination of the sample table 11, "jerk time" the duration of the change in the acceleration of the sample table 11 when beginning to move or stopping or of the change in acceleration based on inertia, "severing distance" the distance by which the engagement parts 21 and 22 of the rods 19 and 20 are to be separated from the groove side walls of the guide parts 23 and 24 in the sample table 11 upon completion of the movement to the target position by the sample table 11, and "stopping threshold" the margin of error for the movement completion position relative to the target position.

The control device 40 comprises a logical pattern generation unit 41, a feedback control unit 42, and an operation log collection unit 43. Further, the feedback control unit 42 comprises an X-direction feedback control unit 44, which controls the movement of the X-axis direction moving table 15 along the X-axis direction, and a Y-direction feedback control unit 45, which controls the movement of the Y-axis direction moving table 16 along the Y-axis direction.

Based on the control parameters that have been set at the information device 70, the logical pattern generation unit 41 generates logical movement position information for moving the sample table 11 from drive start positions $x(0)$, $y(0)$ to target positions xtg, ytg that have been set as control parameters. This logical movement position information is generated as target position command values $xtg(i)$, $ytg(i)$ by breaking it up into finer intermediate target movement positions $x(i)$, $y(i)$ between drive start positions $x(0)$, $y(0)$ and target positions xtg, ytg based on control period tc of the feedback control unit 42 without being affected by drive conditions, such as the initial states of the gap parts 25 and 26 at drive start positions $x(0)$, $y(0)$, and so forth.

Based on the logical movement position information comprising a set of target position command values $xtg(i)$, $ytg(i)$ from drive start positions $x(0)$, $y(0)$ to target positions xtg, ytg thus generated by the logical pattern generation unit 41, the feedback control unit 42 controls the driving of the sample table 11 per predetermined control period tc. It is noted that this control period tc, partly in connection with the fact that the actuators of the sample table 11 to be controlled are the pulse motors (stepping motors) 27 and 28, is preset based on a likelihood related to their resolution and to the processing capability of the feedback control unit 42 itself (the proportion of the time such processing takes relative to one control period), and is, specifically, a value between 1 KHz (a period of 1 ms) and 10 KHz (a period of 100 μs).

The feedback control unit 42, in terms of its function, may be divided into the X-direction feedback control unit 44, which controls the movement of the X-axis direction moving table 15, and the Y-direction feedback control unit 45, which controls the movement of the Y-axis direction moving table 16. Further, the feedback control units 44 and 45 each comprise a laser metrology value reception unit 46, a speed command value generation unit 47, and a pulse generation unit 48. The configuration of each of the units 46 to 48 is described below taking the X-direction feedback control unit 44 as an example.

The laser metrology value reception unit 46 receives a laser metrology signal outputted from the X-axis direction laser interferometer 33, calculates a laser metrology value indicating current X-axis direction movement position $x(i)$ of the X-axis direction moving table 15, and supplies it to the speed command value generation unit 47 and the operation log collection unit 43.

For each control period tc mentioned above, based on current X-axis direction movement position $x(i)$ of the X-axis direction moving table 15, which is supplied from the laser metrology value reception unit 46, and on target position command value $xtg(i)$ corresponding to the logical movement position information generated by the logical pattern generation unit 41, the speed command value generation unit 47 calculates deviation $dx(i)$ between the two. Based on deviation $dx(i)$ thus calculated, etc., the speed command value generation unit 47 generates speed command value $vx(i)$ corresponding to iteration i as of that point in time in control period tc, and supplies it to the pulse generation unit 48 and the operation log collection unit 43.

The pulse generation unit 48 generates motor drive pulse $Px(i)$ for moving the X-axis direction moving table 15 at a speed corresponding to speed command value $vx(i)$ supplied from the speed command value generation unit 47, and supplies it to the X-axis pulse motor 27 and the operation log collection unit 43.

Thus, for each control period tc of the speed command value generation unit 47, the X-axis pulse motor 27 is driven by a rotation amount corresponding to motor drive pulse $Px(i)$ supplied from the pulse generation unit 48, and the engagement part 21 of the X-axis rod 19 attached to the X-axis ball screw 17 advances/retreats along the X-axis direction at a speed corresponding to speed command value $vx(i)$.

In addition, for each control period tc, the operation log collection unit 43 collects laser metrology value (the X-axis direction movement position of the X-axis direction moving table 15) $x(i)$, target position command value $xtg(i)$, speed command value $vx(i)$, and motor drive pulse $Px(i)$. Thus, log information regarding the X-axis direction moving table 15 from when movement of the sample table 11 begins up to when it ends (ceasing movement) is collected/accumulated in the operation log collection unit 43.

Further, the Y-direction feedback control unit 45 likewise comprises units 46 to 48 similar to those of the X-direction feedback control unit 44 described above. Thus, in conjunction with the driving of the X-axis direction moving table 15 to target position xtg by the X-direction feedback control unit 44, the Y-direction feedback control unit 45 drives the Y-axis direction moving table 16 to target position ytg in the same control period tc.

Thus, with respect to the movement of the sample table 11 to target positions xtg, ytg that have been set as the current control parameters, and as log information thereof, laser metrology values $x(i)$, $y(i)$, target position command values $xtg(i)$, $tg(i)$, speed command values $vx(i)$, $vy(i)$, and motor drive pulses $Px(i)$, $Py(i)$ for each iteration i of control period tc with respect to the speed command value generation unit 47 are accumulated in the operation log collection unit 43 as the sample table 11 moves. The log information regarding the movement of the sample table 11 to target positions xtg, ytg thus accumulated in the operation log collection unit 43 is read by the information device 70 through a predetermined operation on the OSD screen of the display 71 of the information device 70 and outputted and displayed.

Figure 2:
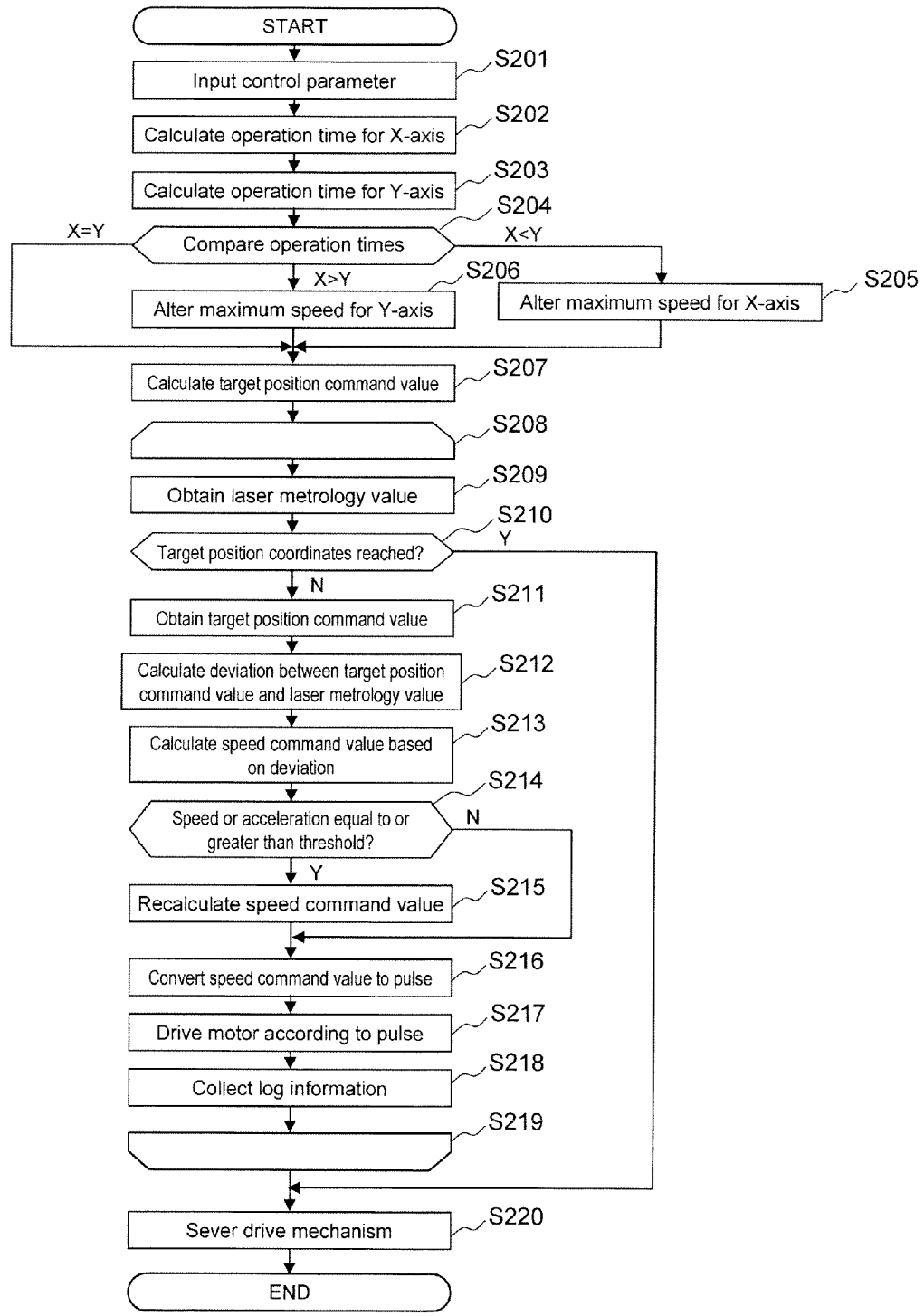
FIG. 2 is a flowchart of a sample table positioning control method by a sample stage device according to this embodiment.
Figure 3:
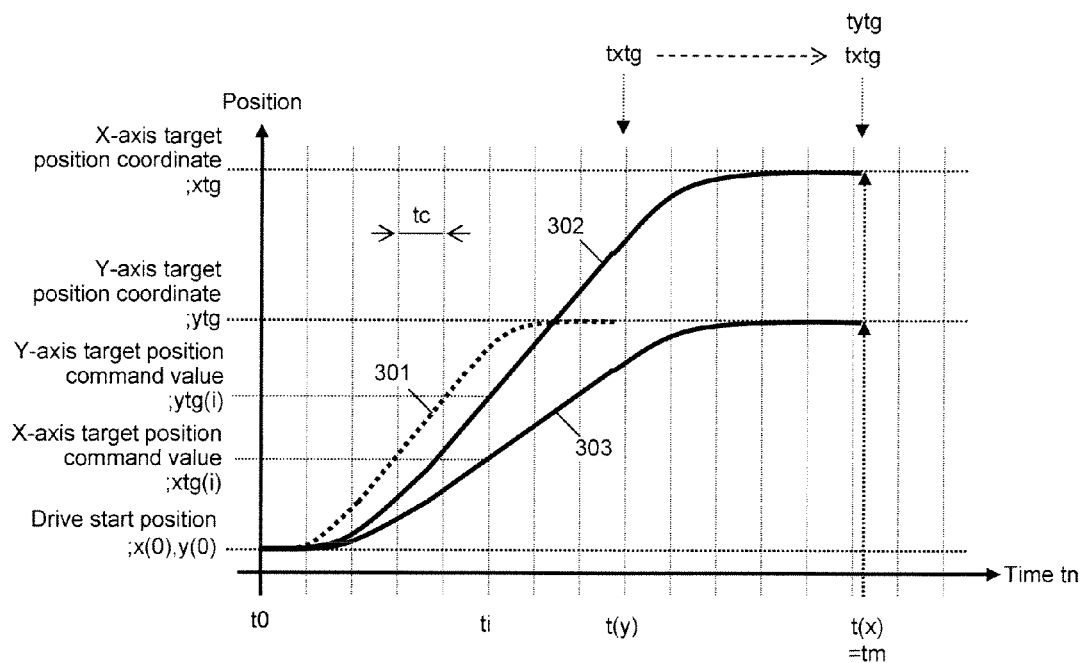
FIG. 3 is a chart illustrating a method of adjusting the drive times and movement speeds of an X-axis direction moving table and a Y-axis direction moving table of a sample stage device according to this embodiment.
Figure 4:
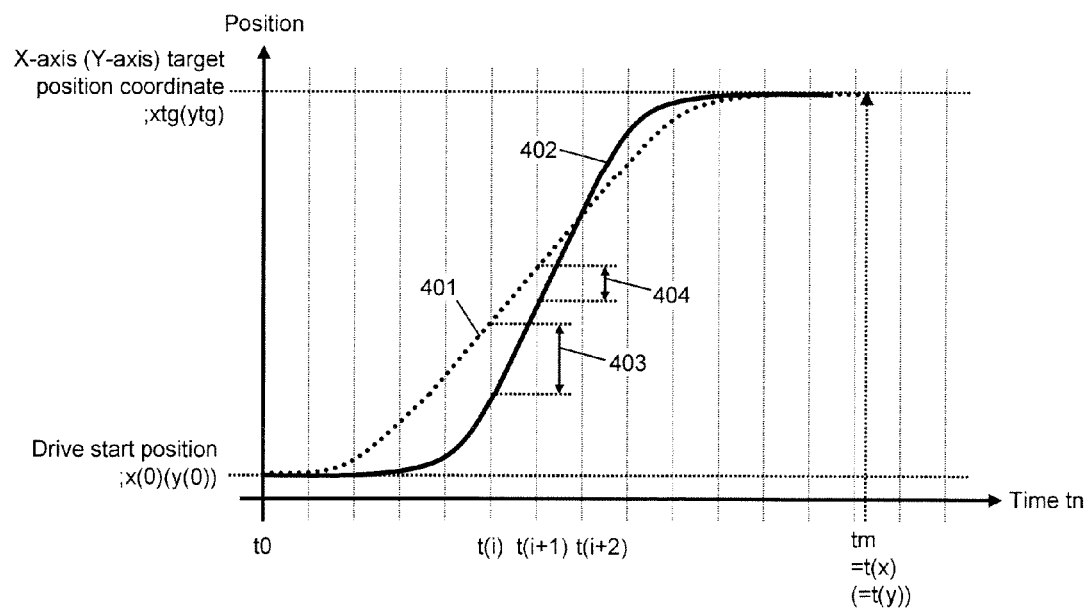
FIG. 4 is a comparative chart between a logical pattern-based case and an actual case, and relates to the movement of an X-axis direction moving table or Y-axis direction moving table of a sample stage device according to this embodiment.

Next, operations of the sample stage device 10 according to the present embodiment are described based on FIG. 2 to FIG. 4.

FIG. 2 is a flowchart of a sample table positioning control method by a sample stage device according to the present embodiment.

First, in observing the sample with the scanning electron microscope, the operator, in step S201, enters control parameters for driving the sample stage device 10, e.g., initial speed, maximum speed, maximum acceleration, target position, jerk time, severing distance, stopping threshold, etc., through a predetermined OSD screen displayed on the display 71 of the information device 70. It is noted that the arrangement may be such that, of these control parameters, the target position, for example, is set separately from the other parameters and in conjunction with the setting of one or a plurality of observation areas on the sample (wafer) 4 when configuring the observation conditions of the scanning electron microscope. The maximum speed and maximum acceleration may be preset by default in accordance with the limitations of the ball screws 17 and 18 and the pulse motors 27 and 28.

With respect to the sample stage device 10, as control parameters are supplied from the information device 70 in connection with the sample movement for sample observation, the logical pattern generation unit 41 of the control device 40 calculates, in steps S202 and S203, the X-axis direction drive time and the Y-axis direction drive time for moving the sample table 11 to target positions xtg, ytg based on the initial speed, target position, and jerk time thereof and within the range of conditions determined by the maximum speed and maximum acceleration that have likewise been set. In this case, the X-axis direction drive time of the sample table 11 corresponds to drive time txtg of the X-axis direction moving table 15, and the Y-axis direction drive time to drive time tytg of the Y-axis direction moving table 16. For this calculation, by way of example, if it is the first movement by the sample table 11 since the wafer 4 was loaded into the sample chamber 2, the positional coordinates for the initial position of the sample table 11 may be used for movement start positions x(0), y(0), whereas if it is not the first movement by the sample table 11, the laser metrology values accumulated in the operation log collection unit 43 from when movement was last terminated may be used. Alternatively, regardless of whether or not it is the first movement by the sample table 11, current laser metrology values x, y as calculated by the laser metrology value reception units 46 based on the laser metrology signals from the laser interferometers 33 and 34 may be used for movement start positions x(0), y(0).

Once drive time txtg of the X-axis direction moving table 15 and drive time tytg of the Y-axis direction moving table 16 are calculated, the logical pattern generation unit 41 compares the two in step S204, and determines which of the X-axis direction and Y-axis direction drive times (operation times) is longer. If one of the X-axis direction and Y-axis direction drive times is longer than the other, the logical pattern generation unit 41 adjusts the movement speed for the shorter drive time in the manner shown in FIG. 3.

FIG. 3 is a chart illustrating a method of adjusting the drive times and movement speeds of the X-axis direction moving table and the Y-axis direction moving table.

As shown in FIG. 3, if drive time tytg in the Y-axis direction is longer than drive time txtg in the X-axis direction, the logical pattern generation unit 41, in step S205, recalculates the maximum speed (the gradient of the linear portion of graph 301 in FIG. 3) in the X-axis direction with respect to the movement to target position (target position coordinate) xtg in the X-axis direction over drive time txtg to make it equal to drive time tytg in the Y-axis direction, and lowers the maximum speed for the movement in the X-axis direction.

Conversely, if drive time txtg in the X-axis direction is longer than drive time tytg in the Y-axis direction, it recalculates, in step S206, the maximum speed in the Y-axis direction with respect to the movement to target position ytg in the Y-axis direction over drive time tytg to make it equal to drive time txtg in the X-axis direction, and lowers the maximum speed in the Y-axis direction.

With respect to this movement speed adjustment, if the sample table 11 were to be moved to target positions xtg, ytg simply at the initial speed entered as a control parameter in step S201, a significant difference between times txtg, tytg at which the movements to target positions xtg, ytg are completed would arise between the X-direction movement and the Y-direction movement due to the difference between the respective movement distances as indicated by the relationship between graphs 301 and 302 in FIG. 3. In FIG. 3, even after the driving of the Y-axis direction moving table 16 has been completed, the X-axis direction moving table 15 is still being driven. Under such conditions, the Y-axis direction moving table 16, whose driving has been completed earlier (corresponding to graph 301), is affected, after it has stopped, by the remaining operation of the X-axis direction moving table 15 (the drive over the t(x)–t(y) portion of graph 302), giving rise to situations where the resting position in the Y-axis direction at completion of movement, that is, target position ytg, is offset.

In order to solve such problems of positional offset after stopping, by having operation times t(x), t(y) for the X-direction and the Y-direction, respectively, for moving the sample table 11 to target positions xtg, ytg be equal regardless of the difference between their respective movement distances (t(x)=t(y)=tm) as indicated by graphs 302 and 303 in FIG. 3, variability in stopping precision due to differences in movement time between the directions (t(x)–t(y)) is reduced. It is noted that in step S204, if the difference between X-axis direction drive time bag and Y-axis direction drive time tytg falls within a pre-defined tolerable range, the logical pattern generation unit 41 does not adjust movement time, that is, movement maximum speed.

Next, in step S207, the logical pattern generation unit 41 calculates, per uniform control period tc that is shorter than operation time tm taken to reach target positions xtg, ytg as indicated by graphs 302 and 303 in FIG. 3, target position command values xtg(i), ytg(i) at which the X-axis direction moving table 15 and the Y-axis direction moving table 16, respectively, are to be located. The logical pattern generation unit 41 thus obtains, along with the control parameters, target position command values xtg(i), ytg(i) for each iteration i (i=0, 1, 2 . . . , m) of the control period by the speed command value generation unit 47 based on a logical pattern that is unaffected by drive conditions, e.g., the initial state of the gap, vibration, noise, etc.

Then, based on such control parameters and target position command values xtg(i), ytg(i), the X-direction feedback control unit 44 and Y-direction feedback control unit 45 of the feedback control unit 42 of the control device 40 repeat, with every control period tc, the processes of steps S209 to S218 at step S208 until the X-axis direction moving table 15 and the Y-axis direction moving table 16 reach target position xtg, ytg, and adjust speed command values vx(i), vy(i) in accordance with target position command values xtg(i), ytg(i).

First, in step S209, the respective speed command value generation units 47 of the X-direction feedback control unit 44 and the Y-direction feedback control unit 45 obtain from the laser metrology value reception units 46 laser metrology values, that is, current X-axis direction movement position x(i) of the X-axis direction moving table 15 and current Y-axis direction movement position y(i) of the Y-axis direction moving table 16.

In step S210, the respective speed command value generation units 47 determine whether or not current X-axis direction movement position x(i) and Y-axis direction movement position y(i) thus obtained have reached target positions xtg, ytg by comparing the two using the stopping threshold of the previously-mentioned control parameters. If the results indicate that the differences between target positions xtg, ytg and current X-axis direction movement position x(i), Y-axis direction movement position y(i) fall within a stopping threshold range of the control parameters, the repeated processes of from steps S209 to S218 are terminated, and the later-discussed drive mechanism severing process of step S220 is performed.

By contrast, if the differences between target positions xtg, ytg and current X-axis direction movement position x(i), Y-axis direction movement position y(i) do not fall within the stopping threshold range, the respective speed command value generation units 47 obtain target position command values xtg(i), ytg(i) generated by the logical pattern generation unit 41 and corresponding to relevant iteration i (i=one of 0, 1, 2 . . . , m) of control period tc.

In step S211, the respective speed command value generation units 47 obtain target position command values xtg(i), ytg(i) corresponding to relevant iteration i (i=one of 0, 1, 2 . . . , m) of control period tc based on a logical pattern comprising target position command values xtg(0) to xtg(m), ytg(0) to ytg(m) determined by the logical pattern generation unit 41 in step S207 and which are unaffected by drive conditions, e.g., the initial state of the gap, vibration, noise, etc.

In step S212, based on target position command values xtg(i), ytg(i) obtained in step S211, as well as on current X-axis direction movement position x(i) and Y-axis direction movement position y(i) obtained in step S209, the respective speed command value generation units 47 calculate deviations dx(i), dy(i) between the two with respect to relevant iteration i of control period tc.

Then, in step S213, based on deviations dx(i), dy(i) thus calculated, the respective speed command value generation units 47 calculate speed command values vx(i), vy(i) that would bring these deviations dx(i), dy(i) closer to 0 in that control period tc. A method of calculating these speed command values vx(i), vy(i) will now be described based on FIG. 4.

FIG. 4 is a comparative chart between a logical pattern-based case and an actual case, and relates to the movement of the X-axis direction moving table or the Y-axis direction moving table.

In the chart, graph 401 represents the movement of the X-axis direction moving table 15 or Y-axis direction moving table 16 to target position xtg, ytg, which is based on a logical pattern that is unaffected by drive conditions, e.g., the initial states of the gap parts 25 and 26, vibration, noise, etc.

In addition, graph 402 represents the movement of the X-axis direction moving table 15 or Y-axis direction moving table 16 to target position xtg, ytg, where, in this case, it is affected by drive conditions, e.g., the initial states of the gap parts 25 and 26, vibration, noise, etc.

In this calculation of speed command values vx(i), vy(i) for relevant control period tc, the X-axis direction moving table 15 or Y-axis direction moving table 16 is ideally driven according to graph 401, which represents the displacement of the X-axis direction moving table 15 or Y-axis direction moving table 16 based on target position command values xtg(i), ytg(i) of a logical pattern that is unaffected by drive conditions.

However, in reality, due to, among other things, the gap parts 25 and 26 between the guide parts 23 and 24 in the X-axis direction moving table 15 and Y-axis direction moving table 16 and the engagement parts 21 and 22 of the rods 19 and 20 as drive mechanisms, it is impossible to drive the X-axis direction moving table 15 or the Y-axis direction moving table 16 according to graph 401, which indicates the displacement of position x, y of the X-axis direction moving table 15 or the Y-axis direction moving table 16 based on target position command values xtg(i), ytg(i) of a logical pattern unaffected by drive conditions.

In reality, as indicated by graph 402, which plots the positional displacement of laser metrology values x(i), y(i), it takes several control periods' worth of time for the change in position x, y to become apparent due to influences of the gap parts 25 and 26 in addition to jerk.

As a result, if, for every subsequent iteration i of control period tc, the driving of the X-axis direction moving table 15 and the Y-axis direction moving table 16 were to be controlled simply with, for example, speed command values vx(i), vy(i) for the speed indicated by the gradient of the linear portion of graph 401 in FIG. 4 corresponding to target position command values xtg(i), ytg(i) of a logical pattern unaffected by drive conditions, this several control periods' worth of delay time would translate directly into a drop in throughput.

As such, in step S213, if, for example, at the beginning of the ith control period tc, indicated as t(i) in FIG. 4, deviations dx(i), dy(i) indicated as 403 in the chart are present, the respective speed command value generation units 47 first calculate, at the beginning of the subsequent i+1th control period tc indicated as t(i+1), such speed command values vx(i), vy(i) for the relevant ith control period tc that would make these deviations dx(i), dy(i) be 0. It is noted that, in this calculation of speed command values vx(i), vy(i) for this control period tc, by way of example, as in the case of the i+2th control period tc indicated as t(i+2) in FIG. 4, at the beginning of this control period tc, if deviations dx(i), dy(i) calculated in step S212 are 0, the respective speed command value generation units 47, in this embodiment, are configured to calculate the same speed command values vx(i), vy(i) as those calculated and determined in the previous i+1th control period tc.

Then, having thus calculated speed command values vx(i), vy(i) in step S213, the respective speed command value generation units 47 perform the checking process indicated by step S214 prior to supplying speed command values vx(i), vy(i) thus calculated to the pulse generation units 48.

In step S214, the respective speed command value generation units 47 check whether or not speed command values vx(i), vy(i) thus calculated in step S213, or accelerations ax(i), ay(i) that occur in attaining these speed command values vx(i), vy(i), exceed maximum speed or maximum acceleration of the control parameters set in step S201. This is because there are limits on speed or acceleration for the ball screws 17 and 18 or the pulse motors 27 and 28 as drive mechanisms, the intent being to prevent such risks as the rotations of the ball screws 17 and 18 not being accurately transmitted and converted into advancement/retreat of the rods 19 and 20, the pulse motors (stepping motors) 27 and 28 losing steps, etc., due to these limits being exceeded.

Depending on the result of this checking process for speed command values vx(i), vy(i) indicated by step S214, if speed command values vx(i), vy(i) calculated in step S213 exceed the limit of the drive mechanism, that is, if maximum speed or maximum acceleration of the control parameters is exceeded, the respective speed command value generation units 47 recalculate speed command values vx(i), vy(i) in step S215 so as not to exceed the limit.

By way of example, in the case of graph 401 and graph 402 shown in FIG. 4, even in the subsequent i+1th control period tc, deviations dx(i), dy(i) indicated as 403 in the chart still remain as deviations dx(i+1), dy(i+1) indicated as 404. It can be understood that, as a result of the checking process indicated by step S214, the recalculations of speed command values vx(i), vy(i) indicated by step S215 have taken place.

The respective speed command value generation units 47 thus control speed in such a manner as to bring deviations dx(i), dy(i) indicated by 403 in the chart closer to 0. As a result, in the i+1th and subsequent control periods tc, they decrease as in deviations dx(i+1), dy(i+1) indicated by 404 in the chart. In addition, in the control period tc just before the mth at operation time tm at which target positions xtg, ytg are reached, deviations dx(m), dy(m) and speed command values vx(i), vy(i) thereof become approximately 0.

The respective speed command value generation units 47 supply to the respective pulse generation units 48 speed command values vx(i), vy(i) that have been calculated and checked in steps S213 to S215. In step S216, the respective pulse generation units 48, based on speed command values vx(i), vy(i) thus supplied, convert them into motor drive pulses Px(i), Py(i) for driving the pulse motors 27 and 28, and output them to the pulse motors 27 and 28. Then, in step S217, the pulse motors 27 and 28 operate according to motor drive pulses Px(i), Py(i) thus converted, thereby causing the rods 19 and 20 attached to the ball screws 17 and 18 to advance/retreat, thus moving the X-axis direction moving table 15 and the Y-axis direction moving table 16 by pushing/pulling them.

In step S218, laser metrology values x(i), y(i) from step S208, target position command values xtg(i), tg(i) from step S211, speed command values vx(i), vy(i) from steps S213 to S215, and motor drive pulses Px(i), Py(i) from step S216 obtained or calculated in the present control period tc are collected as log information by the operation log collection unit 43, and are stored by the information device 70 in such a manner as to enable monitoring, or searching at a later time.

Thus, the log information stored in step S218 is obtained by the information device 70 and displayed on the screen of its display 70. With respect to the manner of display thereof, by way of example, if laser metrology values and target position command values are to be displayed in contrast to each other, the behavior of the sample table 11 comprising the X-axis direction moving table 15 and the Y-axis direction moving table 16 as represented by graph 401 and graph 402 in FIG. 4 may be visualized. In addition, by thus visualizing log information, it may be used for behavior analysis in the event of an abnormal operation by the sample table 11.

After the log information collection process indicated by step S218 has been performed, the X-direction feedback control unit 44 and Y-direction feedback control unit 45 of the feedback control unit 42 of the control device 40 return to step S208 from step S219, and repeatedly execute the processes from step S209 to step S218 until it is confirmed in step S210 that target positions xtg, ytg have been reached.

By thus repeatedly performing, per control period tc, the processes indicated by steps S209 to S218 based on target position command values xtg(i), ytg(i) of a logical pattern unaffected by drive conditions, it becomes possible to control the movements of the X-axis direction moving table 15 and the Y-axis direction moving table 16 in such a manner as to follow the logical pattern.

Further, if, in step S210, it is confirmed by the respective speed command value generation units 47 that current X-axis direction movement position x(i) and Y-axis direction movement position y(i) have reached target positions xtg, ytg, then in step S220, the respective speed command value generation units 47 execute operations in which the X-axis direction moving table 15 and the Y-axis direction moving table 16 are severed from their corresponding drive mechanisms in order to prevent thermal drift caused by the heat generated from the pulse motors 27 and 28 and the ball screws 17 and 18.

In these drive mechanism severing operations, the respective speed command value generation units 47 generate speed command values that cause the rods 19 and 20 to advance/retreat in the opposite direction to the direction in which they were being pushed/pulled up to that point and by a predetermined amount that is less than the difference (e.g., 50 μm) between the groove widths of the guide parts 23 and 24 in the X-axis direction moving table 15 and the Y-axis direction moving table 16 and the widths of the engagement parts 21 and 22 of the X-axis rod 19 and the Y-axis rod 20. They then output these values to the pulse generation units 48 to perform the drive mechanism severing operations.

As described above, with a sample stage device of the present embodiment, high-speed positioning control may be achieved without being affected by the drive conditions of the sample table 11, and such drive conditions as the gap before the table is driven, etc.

In addition, moving to a tentative target position becomes unnecessary, and it becomes possible to move directly to the actual target position. Thus, because such control switching as between high-speed drive for moving to a tentative target position and low-speed drive for moving to the actual target position, etc., becomes unnecessary, high-speed positioning control may be achieved.

All publications, patents, and patent applications cited herein are incorporated by reference in their entirety.

REFERENCE SIGNS LIST

2 Sample chamber
3 Sample chamber housing
4 Sample (wafer)
10 Sample stage device
11 Sample table
12 Base
13 Center table (X-axis direction moving table)
14 Top table
15 X-axis direction moving table
16 Y-axis direction moving table
17, 18 Ball screw
19, 20 Rod
21, 22 Engagement part
23, 24 Guide part
25, 26 Gap part
27, 28 Pulse motor
29 Sample holder
31, 32 Bar mirror
33, 34 Laser interferometer
40 Control device
41 Logical pattern generation unit
42 Feedback control unit
43 Operation log collection unit
44 X-direction feedback control unit
45 Y-direction feedback control unit
46 Laser metrology value reception unit
47 Speed command value generation unit
48 Pulse generation unit
70 Information device
71 Display

The invention claimed is:

1. A sample stage device including a table for mounting a sample, a plurality of drive mechanisms provided so as to correspond to respective axial directions of a two-dimensional plane in which the table is moved, and a measuring mechanism for measuring a position of the table in each of the axial directions in real time, the sample stage device being configured to cause an action part of each of the drive mechanisms, which engages with the table with a gap in-between, to advance/retreat along the relevant axial direction to move the table in the relevant axial direction, the sample stage device comprising:

logical pattern generator which, in moving the table, breaks up, in accordance with a pre-defined control parameter, an interval over which the table moves from the movement start position to a destination position in each of the axial directions, and generates a position command value per predetermined period in each of the axial directions;

speed command value generator which generates, per predetermined period and based on a deviation between a position command value of the period and a measured position of the period as measured by the measuring mechanism, a speed command value for driving each of the drive mechanisms during the period; and drive mechanism driver which supplies to each of the drive mechanisms a drive signal that causes each of the action parts to advance/retreat in the corresponding axial direction at the generated speed command value.

2. The sample stage device according to claim 1, wherein the logical pattern generator, in generating the position command value per predetermined period, makes drive times of the respective drive mechanisms be equal to each other.

3. The sample stage device according to claim 1 or 2, further comprising;

operation log unit which, per predetermined period, collects and stores as operation log information: the position command values for the period generated by the logical pattern generator the measured positions for the period measured by the measuring mechanisms; the speed command values for the period generated by the speed command value generator; the drive signal for the period supplied to each of the drive mechanisms from the drive mechanism driver.

4. The sample stage device according to claim 3, further comprising;

an information device that comprises a display that displays the operation log information stored on the operation log.

5. The sample stage device according to claim 4, wherein the information device comprises an input for inputting the control parameter manually.

* * * * *